(12) United States Patent
Muramatsu

(10) Patent No.: US 6,303,874 B1
(45) Date of Patent: Oct. 16, 2001

(54) ELECTRONIC PARTS MODULE AND ELECTRONIC EQUIPMENT

(75) Inventor: Eiji Muramatsu, Toyoshino-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/180,737

(22) PCT Filed: Mar. 5, 1998

(86) PCT No.: PCT/JP98/00931

§ 371 Date: Nov. 12, 1998

§ 102(e) Date: Nov. 12, 1998

(87) PCT Pub. No.: WO98/41067

PCT Pub. Date: Sep. 17, 1998

(30) Foreign Application Priority Data

Mar. 12, 1997 (JP) .................................................. 9-057849

(51) Int. Cl.[7] ...................................................... H05K 1/16
(52) U.S. Cl. ........................... 174/260; 174/267; 361/773
(58) Field of Search ..................................... 174/260, 261, 174/267; 361/760, 772, 773, 785, 791, 774; 257/696, 773

(56) References Cited

U.S. PATENT DOCUMENTS

| 4,647,126 | * | 3/1987 | Sobota, Jr. ............................. | 439/74 |
| 5,442,134 | * | 8/1995 | Miyazaki et al. .................... | 174/52.4 |
| 5,484,964 | * | 1/1996 | Dawson et al. ...................... | 174/261 |
| 5,945,637 | * | 8/1999 | Katsumata et al. .................. | 174/267 |
| 5,952,727 | * | 9/1999 | Takano et al. ....................... | 257/784 |
| 5,977,643 | * | 11/1999 | You et al. ............................ | 257/784 |
| 6,016,254 | * | 1/2000 | Pfaff .................................... | 361/769 |

FOREIGN PATENT DOCUMENTS

| 50-14955 | 6/1948 | (JP) . |
| 61-56485 | 3/1986 | (JP) . |
| 1-86267 | 6/1989 | (JP) . |
| 4-61320 | 5/1992 | (JP) . |
| 4-181671 | 6/1992 | (JP) . |

* cited by examiner

Primary Examiner—Jeffrey Gaffin
Assistant Examiner—Jeremy Norris
(74) Attorney, Agent, or Firm—Harness, Dickey & Pierce, P.L.C.

(57) ABSTRACT

A liquid crystal display module (1) constructed such that a base end portion (20A) of a pin terminal (20) is joined to an input terminal (18) of a liquid crystal panel (10). A front end portion (20B) of the pin terminal (20) is disposed inwardly of the outer peripheral edge of the liquid crystal panel (10). This allows the portion where the pin terminal (20) is soldered to the circuit board (2) to be located at the back of the liquid crystal panel (10). The amount of space used for mounting the liquid crystal display module (1) onto the circuit board (2) can be minimized, that is it can be reduced by an amount based on the size of the liquid crystal panel 10, thereby allowing very efficient use of space.

10 Claims, 9 Drawing Sheets

ELECTRONIC PARTS MODULE AND ELECTRONIC EQUIPMENT

TECHNICAL FIELD

The present invention relates to an electronic part module and an electronic device, and, more particularly, to an electronic part module which is connected to a circuit board through a pin terminal, and an electronic device including the electronic part module.

BACKGROUND ART

Various electronic devices, such as liquid crystal displays and printers, employ various electronic parts, such as a liquid crystal display (LCD) panel, an electronic print element (such as a thermal printer head), or an optical sensor.

In general, such electronic parts need to be electrically connected to a circuit board, such as a printed board. A connecting means, for connecting the electronic part to the circuit board, and the electronic part that is connected form an electronic part module. Various connecting means have been conventionally proposed for use, one of which is the pin terminal.

An example of a conventionally known electronic part module using a pin terminal is shown in FIG. 9. (Refer to Japanese Patent Unexamined Publication No. 1-206317.) The liquid crystal display module 100 comprises a liquid crystal panel 101, formed by filling liquid crystal in the space between two glass or film bases, and a pin terminal 80 which is mounted to the liquid crystal panel 101. The pin terminal 80 has a clip-shaped base end portion 80A and a front end portion 80B which extends from the base end portion 80A. The base end portion 80A is mounted to the liquid crystal panel 101 by fitting it to the portion of the liquid crystal panel 101 where the input terminal 102 is formed.

The front end portion 80B of the pin terminal 80 is disposed outwardly of the outer peripheral edge of the liquid crystal panel 101. When the front end portion 80B is joined to the circuit board 103 by soldering, the liquid crystal display module 100, used as the electronic part module, is mounted to the base 103. In the liquid crystal display module 100 using pin terminal 80, the pin terminal 80 can be easily connected by soldering. Therefore, such liquid crystal display modules are, in recent years, becoming widely used.

Liquid crystal display modules are, in general, being widely used as information display devices in various electronic devices, such as portable telephones or small information devices. In order to make such electronic devices easier to carry around, it is necessary to make them smaller. On the other hand, in order to increase the amount of data which can be displayed on the liquid crystal display screen, it is necessary to make the screen larger. Thus, there is a demand for electronic devices in which other parts (such as a speaker if the electronic device is a portable telephone), disposed adjacent to the liquid crystal display module, can be disposed closer to the liquid crystal module.

However, the conventional display module 100 of FIG. 9 cannot respond to this demand. The space at the circuit board 103 must be located at the outer side of the liquid crystal display module 100 in order to allow soldering of the front end portion 80B of the pin terminal 80 to the circuit board 103, so that extra space must be provided at the circuit board 103.

This problem occurs not only in liquid crystal display modules, but also in other types of electronic part modules, such as electronic print element modules and optical sensor modules.

In view of the above-described problem, it is an object of the present invention to provide an electronic part module which allows the use of a minimum amount of space for mounting an electronic part module to a circuit board so that efficient use of space can be realized and an electronic device using such an electronic part module.

SUMMARY OF THE INVENTION

To this end, according to the present invention, there is provided an electronic part module in which a base end portion of a pin terminal is joined to an input terminal of an electronic part, wherein a front end portion of the pin terminal is disposed inwardly of the outer peripheral edge of the electronic part.

According to the electronic part module, the front end portion of the pin terminal is disposed inwardly of the outer peripheral edge of the electronic part, so that the portion where the pin terminal is connected to the circuit board by soldering is provided at the back of the electronic part. Therefore, it is possible to eliminate any portions that protrude outwardly of the electronic part, or to reduce the area of any protruding portion.

Accordingly, it is possible to minimize the amount of space at the circuit board, which is required to mount the electronic part module thereto, to about the size based on the size of the electronic part itself. This allows efficient use of space.

Preferably, the pin terminal is made of a springy material, such as springy phosphor bronze. This allows the base end portion of the pin terminal to be joined to the electronic part by the spring force of the base end portion, thereby making it unnecessary to use solder or other joining materials.

Ordinarily, a plurality of pin terminals are provided. Various electronic circuit parts (that is chip parts), containing resistors or capacitors, may be mounted at predetermined pin terminals (or between predetermined pin terminals) of the plurality of pin terminals. When electronic circuit parts are mounted to pin terminals, it becomes unnecessary to mount these parts to the circuit board, thereby allowing efficient use of space accordingly.

When the electronic module is one in which an electronic circuit part, such as an IC, is mounted to the electronic part, as in a COG (chip-on-glass) type liquid crystal display module in which a liquid crystal driver IC is mounted to the liquid crystal panel, the mounting locations of the electronic circuit part and pin terminals may be shifted in a direction of extension of an edge of the electronic part where the pin terminals are mounted. In this case, the mounting locations of the electronic circuit part, such as an IC, and the pin terminals do not overlap, making it possible to reduce the amount of extension of the electronic part, so that the electronic circuit part and the pin terminals can be arranged with greater efficiency.

According to the present invention, there is provided an electronic device comprising the above-described electronic part module, and a circuit board having mounted thereto the electronic part module. The front end of each pin terminal is bent inwardly of the outer peripheral edge of the electronic part in order to be mounted to the circuit board.

In the electronic device, the front end of the pin terminal mounted to the electronic part module may be joined to the glass substrate by inserting the front end of the pin terminal into a through hole provided at the circuit substrate with, for example, soldering. Here, the through hole may either be an electrically conductive through hole used for electrically connecting a multilayered wiring layer, or an electrically nonconductive through hole having provided thereat a solder land.

In the electronic device comprising the above-described electronic module and a circuit board which is connected to the electronic part module, electronic part side connector may be provided on the electronic part side and a circuit substrate side connector may be provided on the circuit substrate side. Then, these connectors are connected together to join the electronic part and the circuit board. When the present invention is applied to such an electronic device, the pin terminals and the circuit board are joined together by joining the front end of the pin terminals of the electronic part module to the connector of the electronic part and fitting the connector of the electronic part module into the connector of the circuit board.

The form and structure of the pin terminal may be selected in accordance with the structure of the electronic device.

BEST MODE FOR CARRYING OUT THE INVENTION (Embodiment 1)

Figure 1:
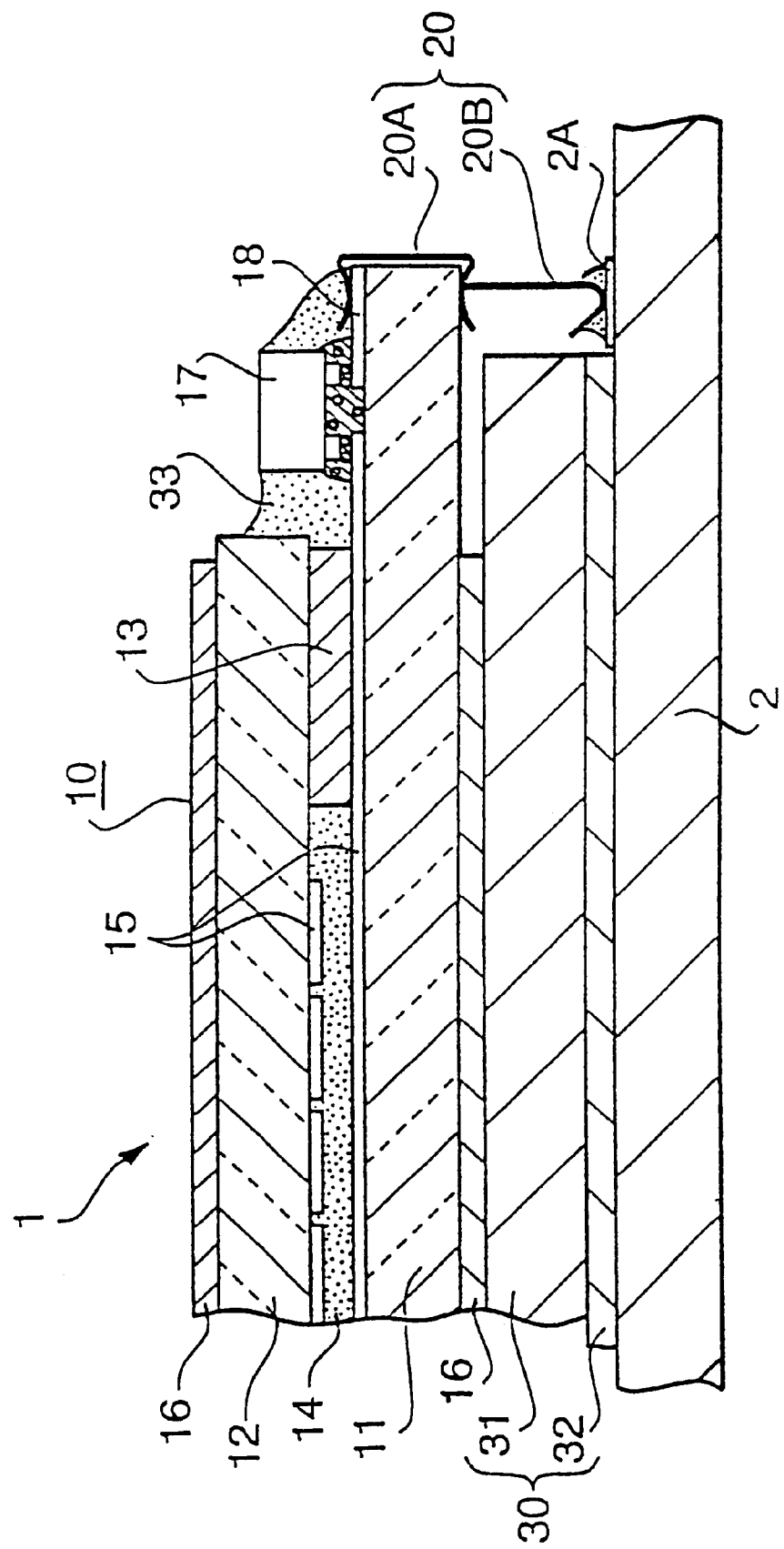
FIG. 1 is a sectional view of the main portion of an embodiment of the electronic part module in accordance with the present invention, with a liquid crystal display module being used as the electronic part module, and a sectional view of the main portion of an electronic device using the electronic module.

FIG. 1 illustrates the main portion of a first embodiment of the electronic part module in accordance with the present invention, with liquid crystal display module 1 being used as the electronic part module, and the main portion of an electronic device using the liquid crystal display module 1. The liquid crystal display module 1 comprises a liquid crystal display (LCD) panel 10, being an electronic part, and pin terminals 20.

The liquid crystal display panel 10 is formed by joining two light transmissive bases, such as glass bases 11 and 12, with a sealant 13, and filling liquid crystal 14 into the space between the glass bases 11 and 12. At the opposing surfaces of the glass bases 11 and 12 are formed transparent electrodes 15 formed by, for example, an ITO film in correspondence with a display pattern. Polarizing plates 16 are mounted to the outer surface of the glass bases 11 and 12.

One of the glass bases 11 and 12, such as the lower glass base 11 in FIG. 1, extends further outward than the other glass substrate 12. A liquid crystal driver IC 17 is mounted to this portion that extends further outward, with an output bump of the liquid crystal driver IC 17 being electrically connected to electrode 15. Accordingly, in the embodiment, a chip-on-glass (COG) type liquid crystal panel 10 is used.

Figure 8:
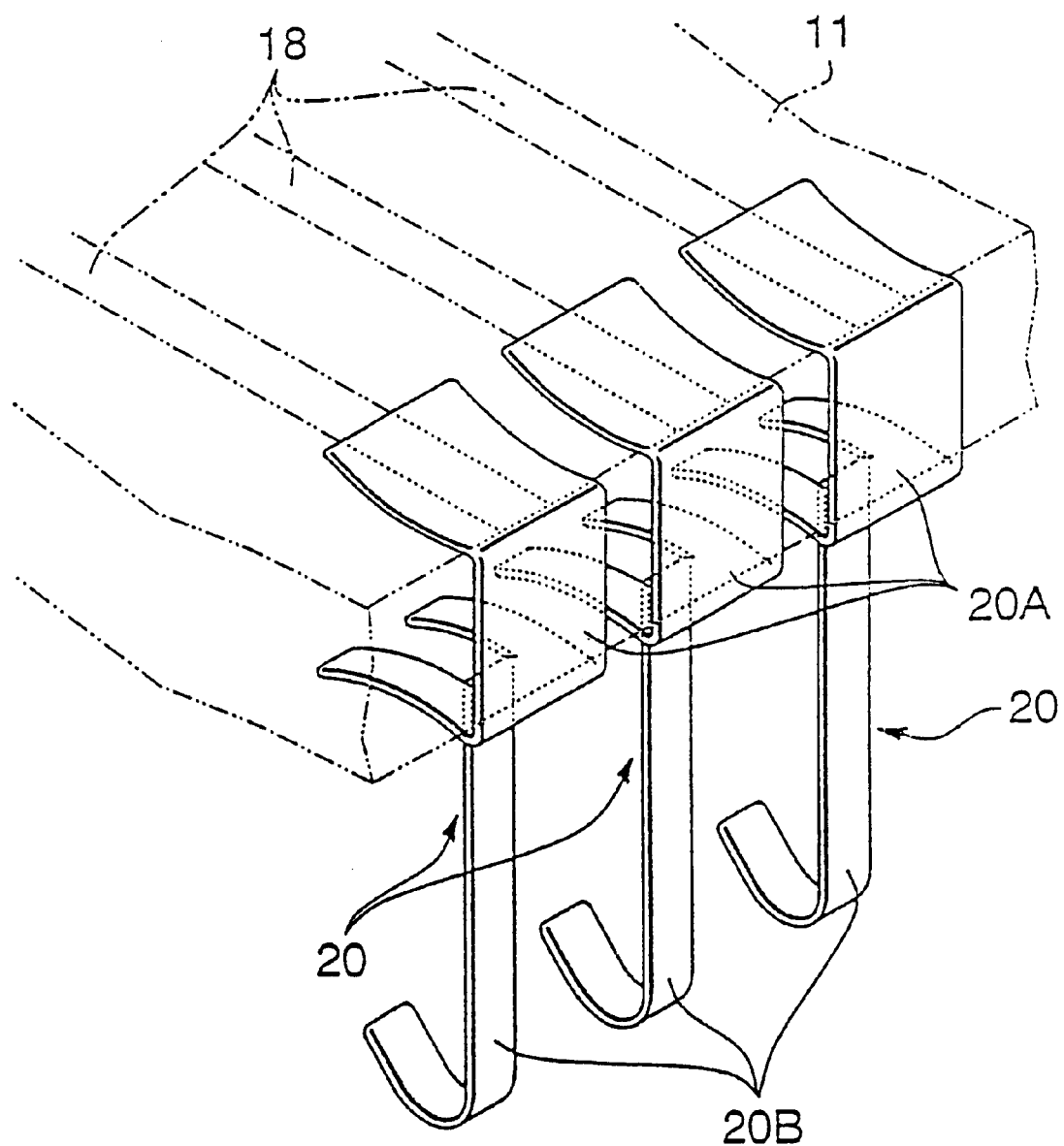
FIG. 8 is a perspective view of a form of pin terminals.
Figure 9:
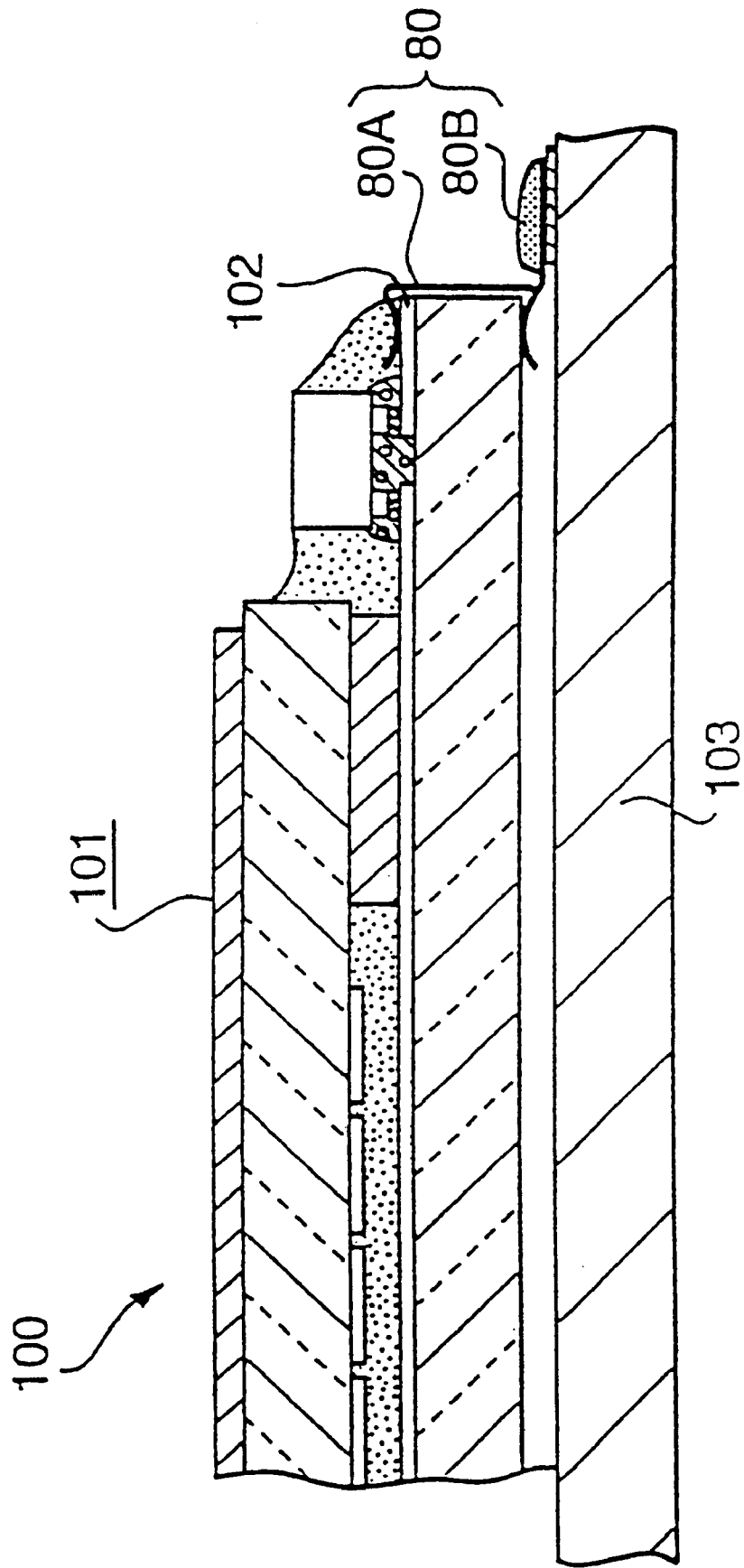
FIG. 9 is sectional view of the main portion of a conventional liquid crystal display module.

A plurality of input terminals 18 are formed at a side of the glass base 11, in a direction perpendicular to the sheet plane. These input terminals 18 are connected to their corresponding pin terminals 20. As shown in FIG. 8, the pin terminals 20 each have a clip-shaped base end portion 20A which is fitted to the glass base 11 and connected to its associated input terminal 18; and a front end portion 20B which is bent inwardly of the liquid crystal panel 10 (see FIG. 1) into a J shape. As shown in FIG. 1, each front end portion 20B is soldered to a terminal land 2A that is provided at the circuit board 2.

Each pin terminal 20 is formed, for example, by coating copper onto spring phosphor bronze (PBSR-½-H), and placing a 9:1 solder (Pb:Sn =9:9) with a thickness of 3 to 8 $\mu$m onto the copper coating. When the dimensions of a pin terminal 20 is small, it may be formed by coating nickel (Ni) onto a spring phospher bronze and coating gold onto the Ni coating.

In the present embodiment, a backlight 30 is disposed between the circuit board 2 and the liquid crystal panel 10.

In the figure, a light-guiding plate 31 and a reflecting plate 32, which make up the backlight 30, are disposed between the circuit board 2 and the liquid crystal panel 10. It is to be noted that the backlight 30 may be provided when necessary.

A molding material 33, such as resin, is used to cover the peripheral portions of the liquid crystal drive IC 17 and the pin terminals 20 mounted to the glass base 11, as well as the connecting portions of the transparent electrodes 15 and the input terminals 18.

The liquid crystal display module 1, formed by fitting the pin terminals 20 to the liquid crystal panel 10 as described above, is built into a suitable portion of an electronic device, such as a portable telephone or a small information device (such as a personal computer). When the liquid crystal display module 1 is being built into the electronic device, the liquid crystal display module 1 is transferred to an assembly line of the electronic device. In the assembly line, the front end 20B of each pin terminal 20 is soldered to the circuit board 2 of the electronic device in order to mount the liquid crystal display module 1 onto the circuit board 2. Here, the circuit board 2 and the front end 20B of each pin terminal 20 can be easily soldered together by bringing, from outside the liquid crystal display module 1, one end of a soldering iron into contact with the portion where each pin terminal 20 and the circuit board 2 is to be connected.

The liquid crystal display module 1 of the first embodiment produces the following effects.

(1) The front end 20B of each terminal 20 which is soldered onto the circuit board 2 is disposed inwardly of the outer peripheral edge of the liquid crystal panel 10, as viewed in a plane, so that the space below the liquid crystal panel 10 can be effectively used for soldering each pin terminal 20. Therefore, compared to conventional electronic part modules, the amount by which the soldered portion of each pin terminal protrudes outwardly of the outer peripheral edge of the liquid crystal panel 10 is reduced, thereby making it possible to minimize the amount of space at the circuit board 2 required for mounting the liquid crystal display module 1. Consequently, other parts, such as a speaker, disposed adjacent to the liquid crystal panel 10, can be disposed sufficiently close to the liquid crystal panel 10, so that the space provided at the circuit board 2 can be used with even greater efficiency, thereby further reducing the size of the electronic device.

(2) Since the front end portion 20B of each pin terminal 20 is bent into a J shape, its area of connection with the circuit board 2 is relatively large, thereby allowing reliable electrical connection of each pin terminal 20 with the circuit board 2 and facilitating soldering operations.

(3) Since each pin terminal 20 is soldered to the circuit board 2, the liquid crystal display module 1 can be easily mounted and any defective liquid crystal display modules 1 can be easily replaced, thereby facilitating the mounting operation of the electronic part module 1 to the circuit board 2.

(Embodiment 2)

Figure 2:
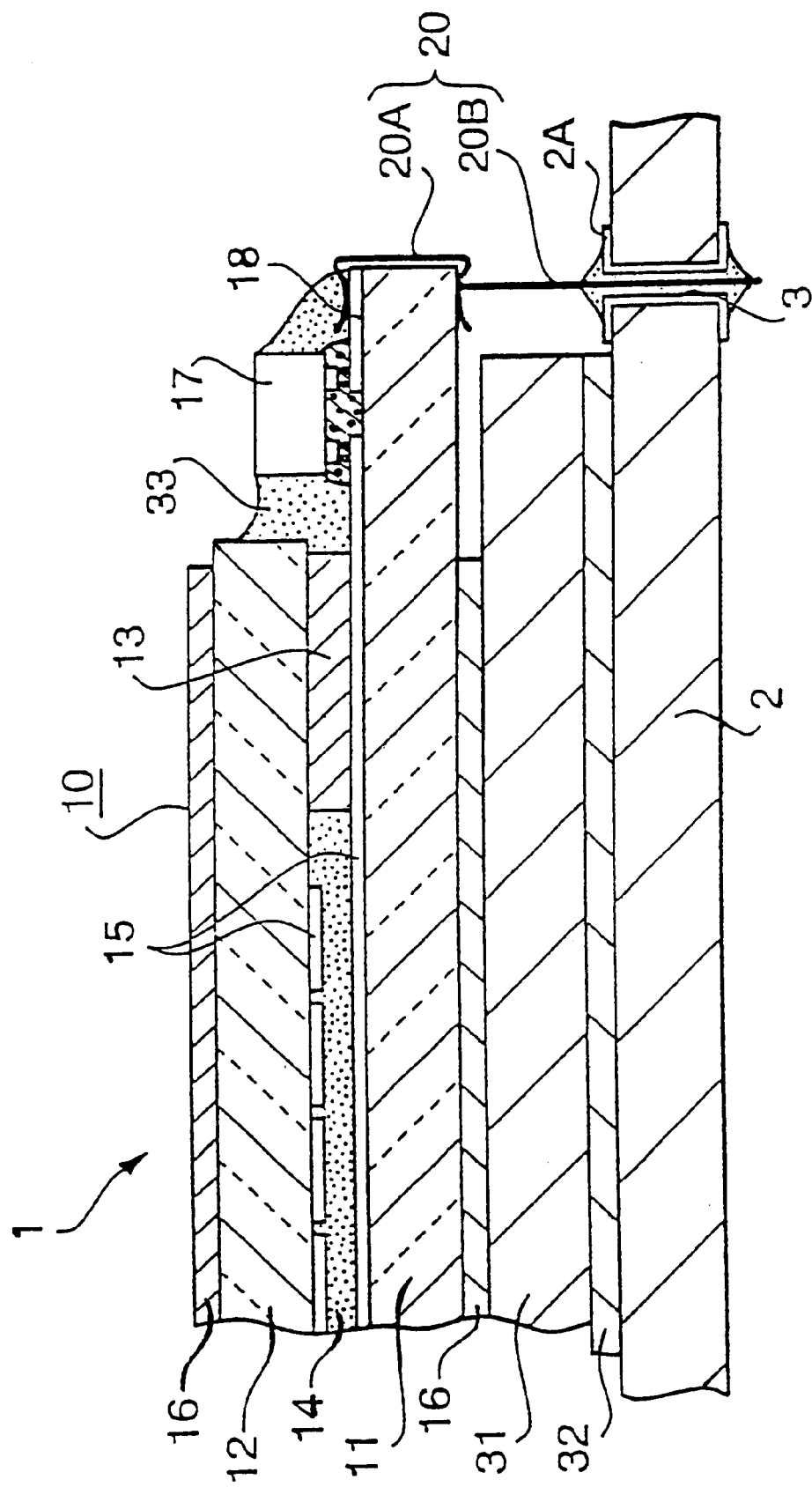
FIG. 2 is a sectional view of the main portion of another embodiment of the electronic part module in accordance with the present invention, with a liquid crystal display module being used as the electronic part module, and a sectional view of the main portion of an electronic device using th electronic part module.

A description will now be given of a second embodiment of the present invention with reference to FIG. 2. In each of the following embodiments described below, corresponding structural parts to those of Embodiment 1 are given the same reference numerals. Their descriptions will either be omitted or simplified. The electronic part module illustrated in FIG. 2 differs from that of FIG. 1 in the way each pin terminal 20 is joined to the circuit board 2. More specifically, a plurality of through holes 3 are formed in the circuit board 2. In the present embodiment, the through holes 3 are electrically conductive through holes. The front end 20B of each pin terminal 20 is inserted into its associated through hole 3, without being bent, and soldered to the circuit board 2.

Although in the liquid crystal display module 1 the front end portion 20B of each pin terminal 20 is not bent, the front end portions 20B are disposed inwardly of the outer peripheral edge of the liquid crystal panel 10, as in the liquid crystal module 1 of FIG. 1. Therefore, the operational effect (1), produced by the electronic part module 1 of the first embodiment, can also be produced by the liquid crystal display module 1 of FIG. 2.

In addition, since each pin terminal 20 is inserted and soldered in its associated through hole 3, the operational effect (3) is also produced. In particular, when each pin terminal 20 is inserted into its associated through hole 3, the pin terminals 20 can by joined to the circuit board 1 by flow soldering, thereby facilitating the mounting operation.

(Embodiment 3)

Figure 3:
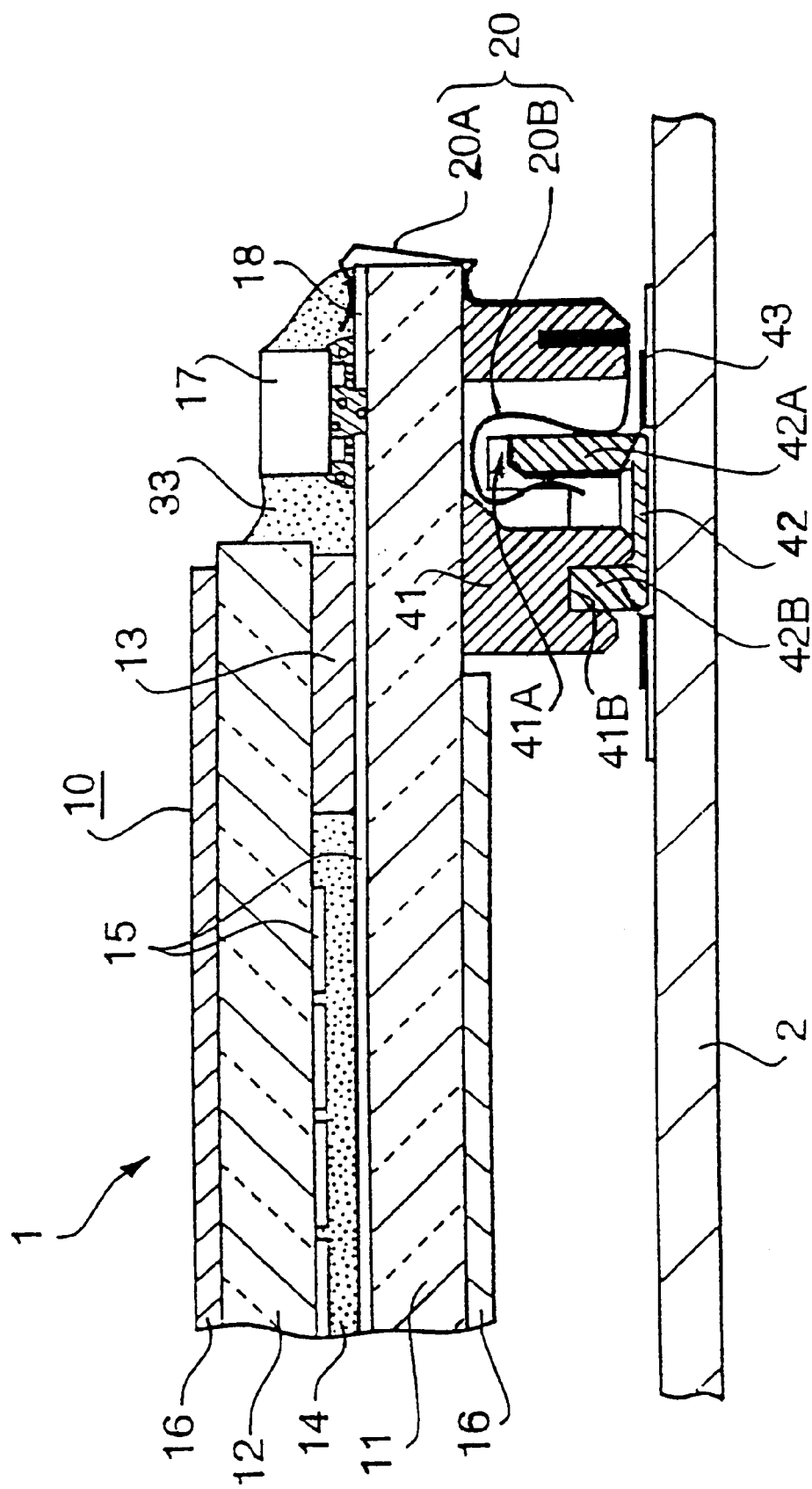
FIG. 3 is a sectional view of the main portion of still another embodiment of the electronic part module in accordance with the present invention, with a liquid crystal display module being used as the electronic part module, and a sectional view of the main portion of an electronic device using the electronic part module.

A description will now be given of a third embodiment of the present invention with reference to FIG. 3. In the electronic device related to the third embodiment, the liquid crystal display module 1 and the circuit board 2 are joined together using connectors. A liquid crystal panel side connector 41 is mounted to the bottom surface of the glass base 11, while a circuit board side connector 42 is mounted to the circuit board 2.

Pin terminals 20 are fitted and secured to the liquid crystal panel side connector 41. The front end 20B of each pin terminal 20 is curved, and a terminal fitting recessed portion 41A is formed. A recess 41B, to which a protrusion 42B of the base connector 42 is fitted, is formed in the liquid crystal panel connector 41. On the other hand, a terminal fitting protrusion 42A, in addition to the protrusion 42B, is formed at the base side connector 42. By fitting the connectors 41 and 42 to each other, the liquid crystal display module 1 and the circuit board 2 are removably connected together.

Although the liquid crystal panel side connector 41 can be joined to the liquid crystal panel using only the pin terminals 20, it can be joined to the liquid crystal panel using a joining clip provided at the liquid crystal side connector 41 or using an adhesive or double-sided tape. Joining the liquid crystal panel side connector 41 using, for example, a joining clip or an adhesive allows it to be firmly supported, even when the connector 41 is subjected to a large force during mounting and removal of the connectors 41 and 42 or during transfer of the electronic part 1 to the assembly line. Even in the liquid crystal display module 1 of the third embodiment, the front end portion 20B of each pin terminal 20 is disposed inwardly of the outer peripheral edge of the liquid crystal panel 10, so that the operation effect (1), produced by the liquid crystal display module 1 of the first embodiment, is also produced by the liquid crystal display module 1 of the third embodiment. In addition, since the liquid crystal panel 10 is joined to the circuit board 2 using connectors, the liquid crystal display module 1 can be more easily mounted, compared to the case where soldering is performed.

(Other Embodiments)

The present invention is not limited to the above-described embodiments. Modifications and improvements can be made within the range of the aforementioned object of the present invention.

Figure 4:
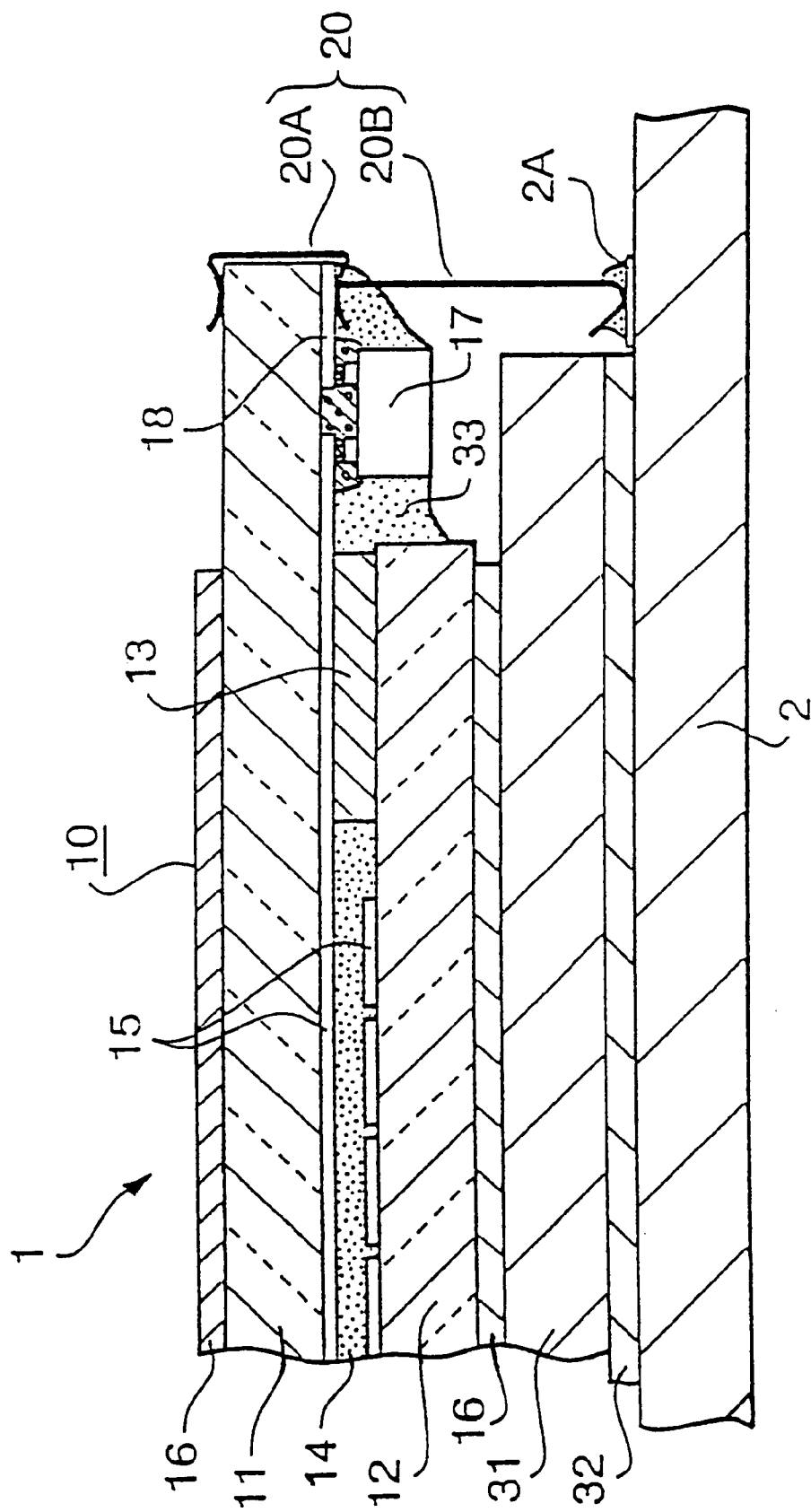
FIG. 4 is a sectional view of the main portion of still another embodiment of the electronic part module in accordance with the present invention, with a liquid crystal display module being used as the electronic part module, and a sectional view of an electronic device using the electronic part module.
Figure 5:
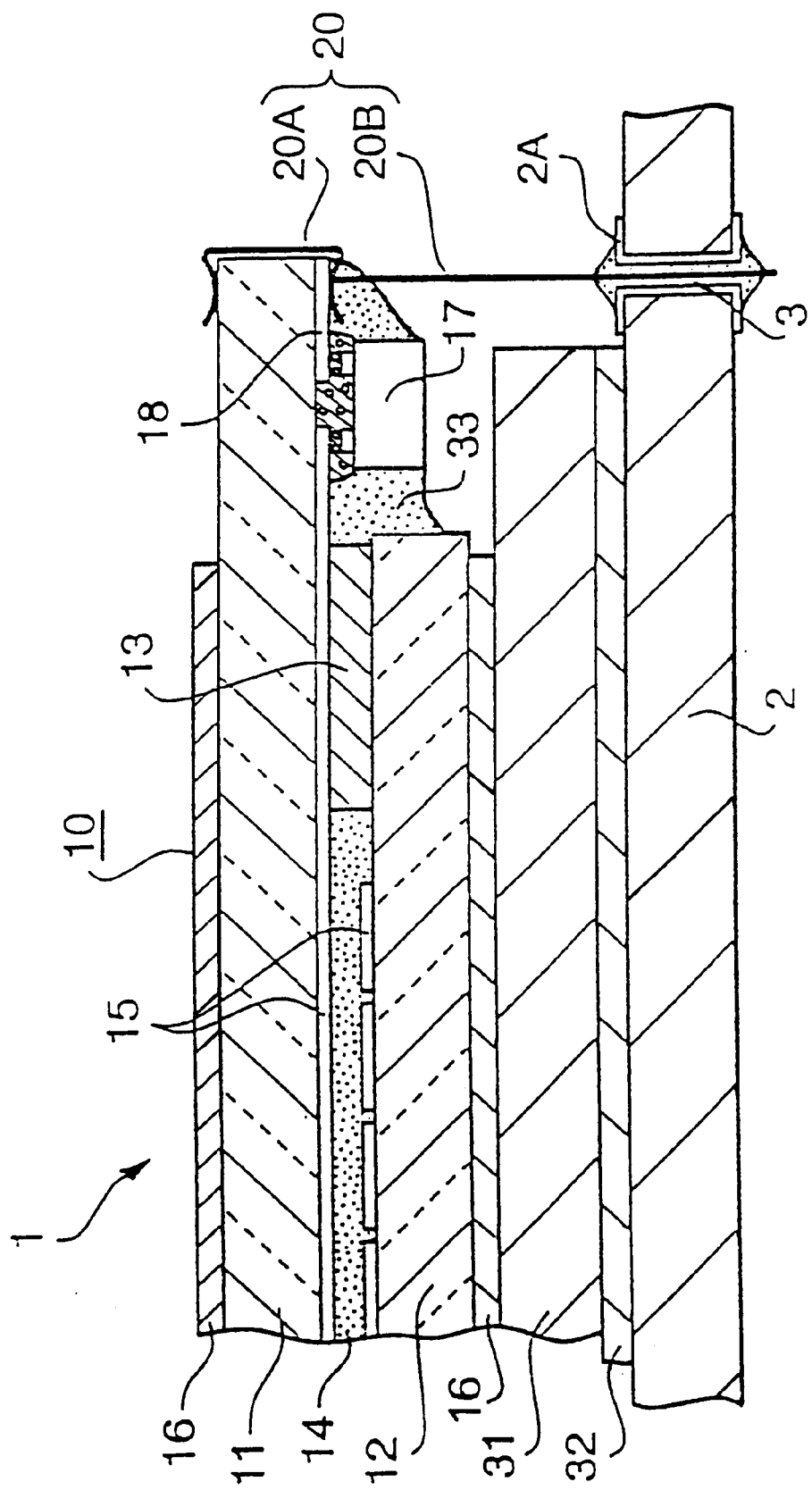
FIG. 5 is a sectional view of the main portion of still another embodiment of the electronic part module in accordance with the present invention, with a liquid crystal display module being used as the electronic part module, and a sectional view of the main portion of an electronic device using the electronic part module.

For example, although in the above-described embodiments the liquid crystal drive IC 17 was mounted to the front side of the liquid crystal display panel 10, it may be disposed on the back side of the liquid crystal display panel 10, as shown in FIGS. 4 and 5. In this case, the liquid crystal driver IC 17 does not protrude from the front surface of the liquid crystal display panel 10, so that even when polymer film bases that are thinner than the glass bases 11 and 12 are used, space can be effectively used, without the liquid crystal driver IC 17 protruding above the polymer film bases.

Figure 6:
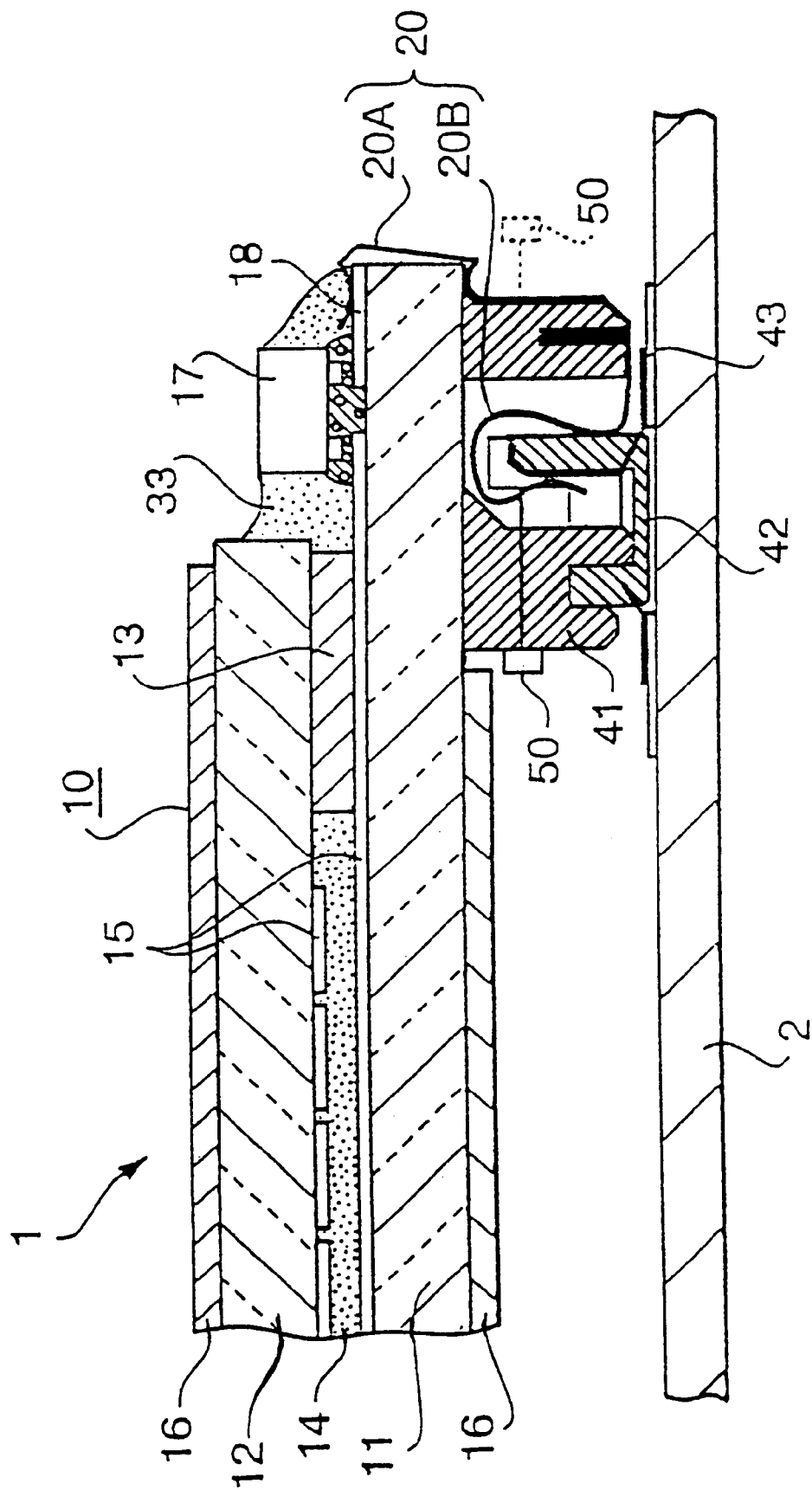
FIG. 6 is a sectional view of the main portion of still another embodiment of the electronic part module in accordance with the present invention, with a liquid crystal display being used as the electronic part module, and a sectional view of the main portion of an electronic device using the electronic part module.

As shown in FIG. 6, electronic circuit parts 50 (that is, chip parts), such as resistors or capacitors, may be connected between predetermined pin terminals 20. When the electronic circuit parts 50 are mounted between the predetermined pin terminals 20, the electronic circuit parts 50 do not have to be mounted to the circuit board 2, thereby allowing the space at the circuit board 2 to be used with even greater efficiency. As indicated by the dotted lines in FIG. 6, the electronic circuit parts 50 may be formed so as to protrude outwardly of the liquid crystal display module 1 from the pin terminals 20. In addition, the electronic circuit parts 50 may also be connected to the pin terminal 20, shown in FIGS. 1, 2, 4, and 5, in addition to the pin terminals 20 that are used in the liquid crystal display module 1 using connectors.

The present invention is applicable not only to a COG type liquid crystal display module 1 in which a liquid crystal driver IC 17 is directly joined to a glass base 11, but also to other types of liquid crystal display modules 1, such as the so-called chip-on-board (COB) type which is constructed such that the liquid crystal driver IC is provided on a circuit board 2 such as a printed board.

Figure 7:
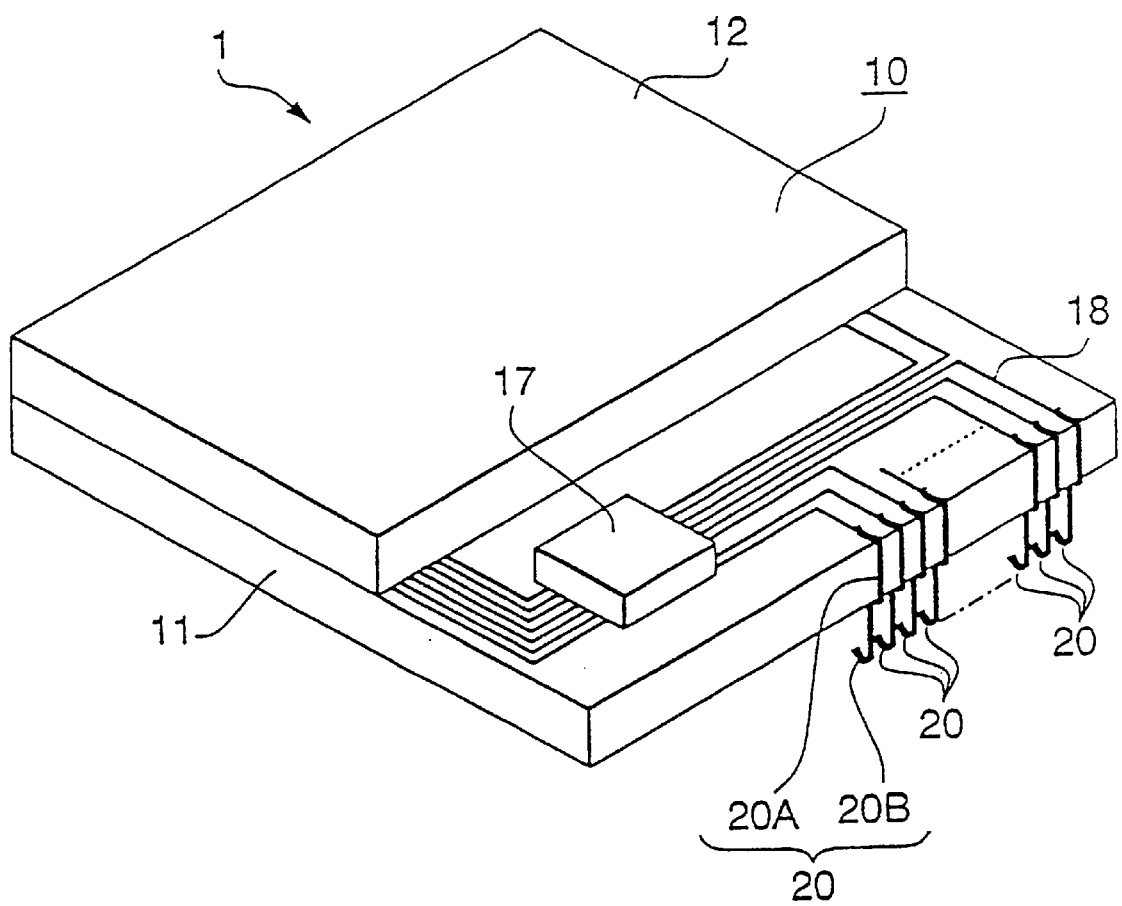
FIG. 7 is a perspective view of still another embodiment of the electronic part module in accordance with the present invention, with a liquid crystal display module being used as the electronic part module.

As shown in FIG. 7, when the COG type liquid crystal display module 1 is used, the liquid crystal drive IC 17 and the pin terminals 20 may be disposed such that they are shifted in a direction of extension of the edge of the liquid crystal panel 10 where the input terminals 18 are formed. In this case, the liquid crystal driver IC 17 and the pin terminals 20 do not overlap in a direction of extension of the glass base 11, so that the extension of the glass base 11 can be reduced, thereby allowing them to be arranged more efficiently.

Although in the foregoing description, the pin terminals 20 were bent into a J shape, they may be bent into other shapes, such as an L shape, as required. When the pin terminals 20 are to be inserted into their corresponding through holes 3, the pin terminals 20 may be bent into any shape, as required, in order to insert the front end portions 20B into their corresponding through holes 3. For example, they may be formed into a crank shape, as shown in FIG. 5. Similarly, the liquid crystal panel side connector 41 and the base side connector 42 may have any form or structure as required.

The present invention is applicable not only to a liquid crystal display module 1, but also to other electronic part modules such as an electronic print element (such as a thermal printer head) module of a thermal printer or an optical sensor module. In addition, the present invention is applicable to various electronic devices using electronic part modules of the aforementioned types.

Industrial Applicability

According to the present invention, the electronic device module may be a liquid crystal display module, a thermal printer head module, an optical sensor module, or the like. In addition, the electronic device may be a liquid crystal display, a printer, or the like.

What is claimed is:

1. An electronic device comprising:
   an electronic part module in which base end portions of pin terminals are joined to input terminals of an electronic part, wherein a front end portion of each of the pin terminals is disposed inwardly of an outer peripheral edge of the electronic part, and wherein said front end portion includes a section extending generally orthogonally from the electronic part and terminating at a bend extending further inwardly relative to the outer peripheral edge;
   a circuit board for mounting thereto the electronic part module, wherein the front end portion of each pin terminal is mounted to the circuit board; and
   a light guiding plate disposed between the electronic part and the circuit board.

2. An electronic device comprising:
   an electronic part module in which base end portions of pin terminals are joined to input terminals on a substrate of an electronic part, wherein a front end portion of each of the pin terminals is disposed inwardly of an outer peripheral edge of the electronic part;
   a circuit board having a through hole in which the front end portion of each of the pin terminals is inserted and mounted to the circuit board;
   a light guiding plate disposed between the electronic part and the circuit board; and
   an electronic circuit part mounted on an outboard side of the substrate of the electronic part relative to said circuit board.

3. An electronic device comprising an electronic part module in which base end portions of pin terminals are joined to input terminals of an electronic part, wherein a front end portion of each of the pin terminals is disposed inwardly of an outer peripheral edge of the electronic part, and a circuit board for mounting thereto the electronic part module, wherein the front end portion of each pin terminal is connected to an electronic part side connector affixed to the electronic part, and wherein the electronic part side connector is capable of being fitted to a circuit base side connector affixed to the circuit board.

4. An electronic part module according to claim 3, wherein predetermined pin terminals of the pin terminals have mounted thereto an electronic circuit part.

5. An electronic part module according to claim 3, wherein the electronic part has mounted thereto an electronic circuit part, and wherein mounting locations of the electronic circuit part and the pin terminals are in a direction of extension of an edge of the electronic part where the pin terminals are mounted.

6. An electronic device comprising:
   an electronic part module;
   a plurality of pin terminals provided on said electronic part module;
   an electronic part;
   a plurality of input terminals provided on said electronic part;
   a base end portion of each of said pin terminals being joined to said input terminals;
   a front end portion of each of said pin terminals being disposed inwardly of an outer peripheral edge of said electronic part, wherein said front end portion includes a section extending generally orthogonally from the electronic part and terminating at a bend extending further inwardly relative to the outer peripheral edge;
   a circuit board for mounting thereto the electronic part module, wherein the front end portion of each pin terminal is mounted to the circuit board; and
   a light guiding plate disposed between the electronic part and the circuit board.

7. An electronic device comprising:
   an electronic part module;
   a plurality of pin terminals provided on said electronic part module;
   an electronic part;
   a plurality of input terminals provided on said electronic part;
   a base end portion of each of said pin terminals being joined to said input terminals;
   a front end portion of each of said pin terminals being disposed inwardly of an outer peripheral edge of said electronic part; and
   a circuit board mounted to said electronic part module wherein said front end portion of each of said pin terminals is connected to an electronic part side connector affixed to said electronic part and wherein said electronic part side connector may be fitted to a circuit base side connector affixed to said circuit board.

8. The electronic device of claim 7 wherein predetermined pin terminals of said plurality of pin terminals have an electronic circuit part mounted thereto.

9. The electronic device of claim 7 further comprising an electronic circuit part mounted to said electronic part wherein a mounting location of said electronic circuit part and said pin terminals is shifted toward an extending edge of said electronic part.

10. An electronic device comprising:

an electronic part module in which base end portions of pin terminals are joined to input terminals on a substrate of an electronic part, wherein a front end portion of each of the pin terminals is disposed inwardly of an outer peripheral edge of the electronic part;

a circuit board having a through hole in which the front end portion of each of the pin terminals is inserted and mounted to the circuit board;

a light guiding plate disposed between the electronic part and the circuit board; and an electronic circuit part mounted on an inboard side of the substrate of the electronic part relative to said circuit board.

\* \* \* \* \*

UNITED STATES PATENT AND TRADEMARK OFFICE
CERTIFICATE OF CORRECTION

PATENT NO. : 6,303,874 B1
DATED : October 16, 2001
INVENTOR(S) : Eiji Muramatsu

It is certified that error appears in the above-identified patent and that said Letters Patent is hereby corrected as shown below:

Title page, Item [54] and Column 1, line 1,
Title, "ELECTRONIC PARTS MODULE AND ELECTRONIC EQUIPMENT"
should be -- ELECTRONIC PART MODULE AND ELECTRONIC DEVICE --.
Item [57], ABSTRACT,
Line 12, "panel 10" and should be -- panel (10) --.

Column 3,
Line 30, "th" should be -- the --.
Line 61, after "is" insert -- a --.

Column 4,
Line 46, delete "drive" and substitute -- driver -- therefor.

Column 6,
Line 41, delete "drive" and substitute -- driver -- therefor.

Column 7,
Line 4, after "IC" insert -- 17 --.
Line 7, delete "drive" and substitute -- driver -- therefor.

Signed and Sealed this

Seventh Day of September, 2004

JON W. DUDAS
*Director of the United States Patent and Trademark Office*